(12) United States Patent
Li

(10) Patent No.: US 10,269,659 B2
(45) Date of Patent: Apr. 23, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/799,706

(22) Filed: Oct. 31, 2017

(65) Prior Publication Data

US 2018/0122701 A1     May 3, 2018

(30) Foreign Application Priority Data

Nov. 1, 2016     (CN) .......................... 2016 1 0941517

(51) Int. Cl.
*H01L 21/70* (2006.01)
*H01L 21/8258* (2006.01)
(Continued)

(52) U.S. Cl.
CPC .... *H01L 21/8258* (2013.01); *H01L 21/02112* (2013.01); *H01L 21/02236* (2013.01); *H01L 21/28255* (2013.01); *H01L 21/28264* (2013.01); *H01L 21/823814* (2013.01); *H01L 21/823821* (2013.01); *H01L 21/823828* (2013.01); *H01L 21/823857* (2013.01); *H01L 27/0924* (2013.01); *H01L 29/16* (2013.01); *H01L 29/20* (2013.01); *H01L 29/42364* (2013.01); *H01L 29/517* (2013.01); *H01L 29/518* (2013.01);
(Continued)

(58) Field of Classification Search
CPC .......... H01L 21/8258; H01L 21/02112; H01L 21/02236
USPC .................................. 257/369, 374
See application file for complete search history.

(56) References Cited

U.S. PATENT DOCUMENTS

| 9,318,335 | B2 * | 4/2016 | Kim ................. H01L 21/28158 |
| 9,362,282 | B1 | 6/2016 | Ando et al. |
| 9,728,463 | B2 * | 8/2017 | Lim ................ H01L 21/823462 |
| 2015/0147876 | A1 * | 5/2015 | Ando ............. H01L 21/823842 438/591 |
| 2015/0228670 | A1 | 8/2015 | Caimi et al. |

(Continued)

OTHER PUBLICATIONS

The European Patent Office (EPO) The Extended European Search Report for 17198487.5 dated Mar. 29, 2018 8 Pages.
S. Sioncke et al: "Passivation Challenges with Ge and III/V Devices", ECS Transactions, vol. 45, No. 4, Apr. 27, 2012 (Apr. 27, 2012), pp. 97-110, XP055364987, US ISSN: 1938-6737, DOI: 10.1149/1.3700458.

*Primary Examiner* — Tan N Tran
(74) *Attorney, Agent, or Firm* — Anova Law Group, PLLC

(57) ABSTRACT

A semiconductor structure and a fabrication method are provided. A fabrication method includes providing a substrate including an NMOS region and a PMOS region; forming a first high-K gate dielectric layer on the NMOS region of the substrate; forming an interfacial layer on the PMOS region of the substrate; forming a second high-K gate dielectric layer on the interfacial layer and the first high-K gate dielectric layer; forming a metal layer on the second high-K gate dielectric layer.

20 Claims, 5 Drawing Sheets

(51) Int. Cl.
    *H01L 21/02*     (2006.01)
    *H01L 21/28*     (2006.01)
    *H01L 21/8238*     (2006.01)
    *H01L 27/092*     (2006.01)
    *H01L 29/16*     (2006.01)
    *H01L 29/20*     (2006.01)
    *H01L 29/423*     (2006.01)
    *H01L 29/51*     (2006.01)
    *H01L 29/66*     (2006.01)
    *H01L 29/78*     (2006.01)

(52) U.S. Cl.
    CPC .. *H01L 29/66545* (2013.01); *H01L 21/02255* (2013.01); *H01L 29/66795* (2013.01); *H01L 29/785* (2013.01)

(56) References Cited

U.S. PATENT DOCUMENTS

2015/0243564 A1*   8/2015   Zhao ................. H01L 29/66545
                                                                           438/591
2016/0315165 A1    10/2016   Lee et al.
2017/0207095 A1*   7/2017   Lee ..................... H01L 21/28518

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610941517.X, filed on Nov. 1, 2016, the entirety of which is incorporated herein by reference.

FIELD OF THE DISCLOSURE

The present disclosure generally relates to the field of semiconductor technologies and, more particularly, relates to a semiconductor structure and a fabrication method thereof.

BACKGROUND

The main semiconductor device component of the integrated circuit, especially of the ultra-large-scale integrated circuit, includes a metal-oxide-semiconductor field effect transistor (MOS transistor). With the continuous development of the integrated circuit manufacturing technology, the technology node and geometric dimension of semiconductor devices continue to decrease following the Moore's Law. When the size of a semiconductor device is reduced to a certain extent, various secondary effects due to the physical limit of a semiconductor device may successively occur, and as a result, scaling down the feature size of a semiconductor device becomes more and more difficult. In the field of semiconductor manufacturing, one of the challenges is to solve the large leakage current problem of semiconductor devices. The large leakage current of a semiconductor device is mainly caused by the continuous decrease of the thickness of the conventional gate dielectric layer.

The conventional solutions to the large leakage current problem include use of a high-K gate dielectric material to replace the traditional silicon oxide gate dielectric material and to use a metal as the gate electrode to avoid the Fermi level pinning effect and the boron permeation effect occurring between the high-K material and the traditional gate electrode material. Introducing a high-K metal gate reduces the leakage current of semiconductor devices.

Although the introduction of a high-K metal gate can improve the electrical performance of semiconductor devices to a certain extent, the electrical performance of semiconductor devices formed by conventional methods still needs to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The fabrication method includes providing a substrate including an NMOS region and a PMOS region; forming a first high-K gate dielectric layer on the NMOS region of the substrate; forming an interfacial layer on the PMOS region of the substrate; forming a second high-K gate dielectric layer on the interfacial layer and the first high-K gate dielectric layer; forming a metal layer on the second high-K gate dielectric layer. The first high-K gate dielectric layer, the second high-K gate dielectric layer, and the metal layer in the NMOS region form a first gate structure while the interfacial layer, the second high-K gate dielectric layer, and the metal layer in the PMOS region form a second gate structure.

Another aspect of the present disclosure includes a semiconductor structure. The semiconductor structure includes a substrate, and the substrate includes an NMOS region and a PMOS region. The NMOS region of the substrate is made of a Group III-V compound material and the PMOS region of the substrate is made of a germanium-containing material. The semiconductor structure also includes a first gate structure on the NMOS region of the substrate and a second gate structure on the PMOS region of the substrate. The first gate structure includes a first high-K gate dielectric layer on the NMOS region of the substrate, a second high-K gate dielectric layer on the first high-K gate dielectric layer, and a metal layer on the second high-K gate dielectric layer. The second gate structure includes an interfacial layer on the PMOS region of the substrate, a second high-K gate dielectric layer on the interfacial layer, and a metal layer on the second high-K gate dielectric layer.

Other aspects of the present disclosure can be understood by those skilled in the art in light of the description, the claims, and the drawings of the present disclosure.

DETAILED DESCRIPTION

Figure 1:
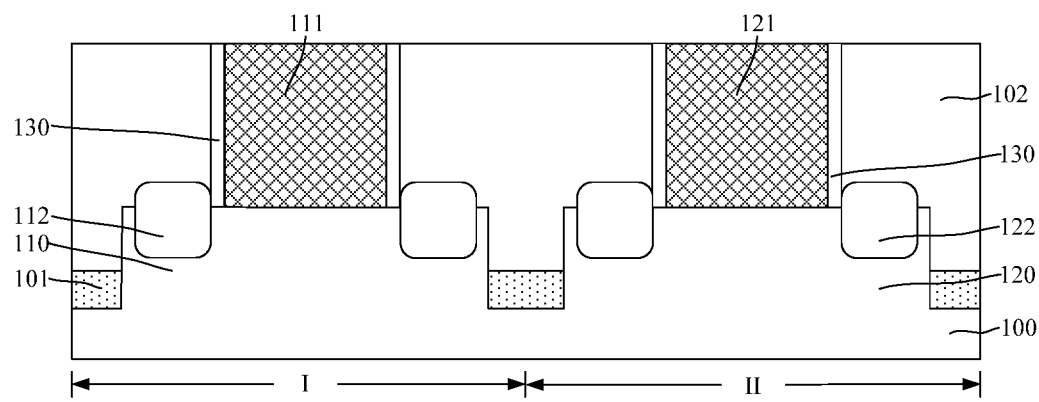
FIGS. 1~12 illustrate schematic structural views of an exemplary semiconductor structure corresponding to certain stages of a fabrication process consistent with the disclosed embodiments.

Reference will now be made in detail to the exemplary embodiments of the disclosure, which are illustrated in the accompanying drawings. Wherever possible, the same reference numbers will be used throughout the drawings to refer to the same or similar parts.

As the technology node of semiconductor devices continues to decrease, high-K gate dielectric materials have been used to replace conventional silicon oxide gate dielectric materials to resolve the gate leakage current problem and the equivalent oxide thickness (EOT) problem, etc. However, the electrical performance of semiconductor devices still needs to be improved.

A method for forming a semiconductor device is provided and analyzed as the following. The method for forming a semiconductor device may include: providing a substrate including an NMOS region and a PMOS region. The NMOS region may have a substrate made of a Group III-V compound and the PMOS region may have a substrate made of a germanium-containing material. An interfacial layer may be formed on the substrate using an oxidation process, followed by forming a high-K gate dielectric layer on the interfacial layer, and forming a metal layer on the high-K gate dielectric layer.

However, the Group III-V compound (e.g., InGaAs) is difficult to be oxidized, and the interfacial layer can be formed only on the PMOS region of the substrate as a portion of the semiconductor structure gate dielectric layer. That is, the gate dielectric layer of the semiconductor structure formed in the NMOS region includes only the high-K gate dielectric layer while the gate dielectric layer of the semiconductor structure formed in the PMOS region includes both the interfacial layer and the high-K gate dielectric layer. As a result, the equivalent oxide thickness (EOT) of the NMOS region is only affected by the thickness of the high-K gate dielectric layer, but the EOT of the transistor formed in the PMOS region is affected by both the thickness of the interfacial layer and the thickness of the high-K gate dielectric layer.

During the semiconductor structure manufacturing process, the EOT of the transistor formed in the PMOS region can be made sufficient to resolve the gate leakage current problem in the PMOS region by adjusting the thickness of both the interfacial layer and the high-K gate dielectric layer. However, the EOT of the transistor formed in the NMOS region needs to be relatively large in order to resolve the gate leakage current problem in the NMOS region. Further, adjustment of the EOT of the transistor formed in the NMOS region can only be achieved by adjusting the high-K gate dielectric layer. Therefore, when increasing the thickness of the high-K gate dielectric layer to satisfy the NMOS performance requirements, the EOT of the transistor formed in the PMOS region may easily become too large and adversely affect the electrical performance of the transistor formed in the PMOS region.

The present disclosure provides a method of solving the aforementioned technology problem. In the disclosure, since the Group III-V compound material is difficult to be oxidized when forming the interfacial layer, in one embodiment, the interfacial layer is formed only on the PMOS region of the substrate while a first high-K gate dielectric layer is formed on the NMOS region of the substrate, followed by forming a second high-K gate dielectric layer on the interfacial layer and the first high-K gate dielectric layer. The interfacial layer can affect the EOT of the transistor formed in the PMOS region, and the thickness of the stacked structure formed by the interfacial layer and the second high-K gate dielectric layer is sufficient to resolve the gate leakage current problem in the PMOS region by adjusting the thicknesses of the interfacial layer and the second high-K gate dielectric layer. To simultaneously improve the gate leakage current problem in the NMOS region and the PMOS region, the present disclosure forms a first high-K gate dielectric layer on the NMOS region of the substrate before forming the second high-K gate dielectric layer. After adjusting the thickness of the second high-K gate dielectric layer to be sufficient for resolving the gate leakage current problem in the PMOS region, the thickness of the first high-K gate dielectric layer can also be adjusted to make the ETO of the NMOS region sufficient to improve the gate leakage current problem in the NMOS region. Compared with the method of forming only the second high-K gate dielectric layer in the NMOS region and forming the interfacial layer and the second high-K gate dielectric layer in the PMOS region, the present disclosure avoids the problem that the electrical performance of the transistor in the PMOS region is adversely affected when the thickness of the second high-K gate dielectric layer is adjusted to satisfy the performance requirements of the transistor in the NMOS region.

The foregoing objects, features and advantages of the present invention will become more apparent from the following detailed description of specific embodiments of the invention taken in conjunction with the accompanying drawings.

Figure 11:
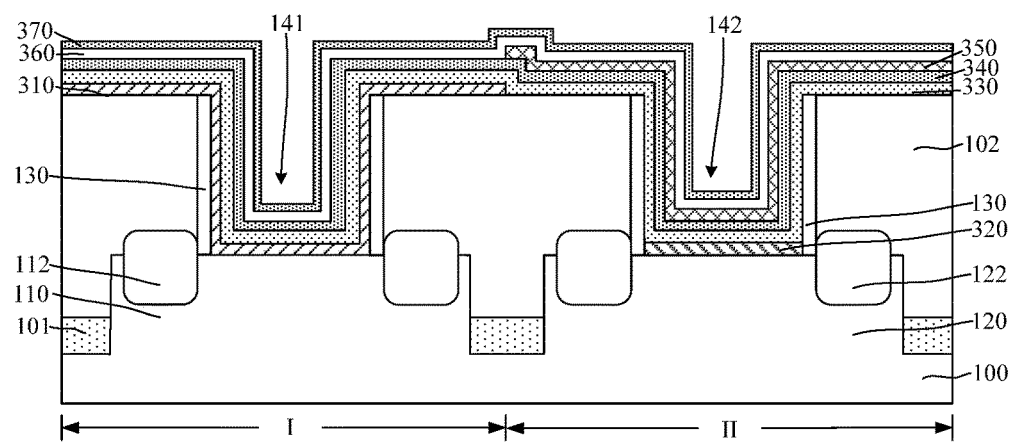
Figure 12:
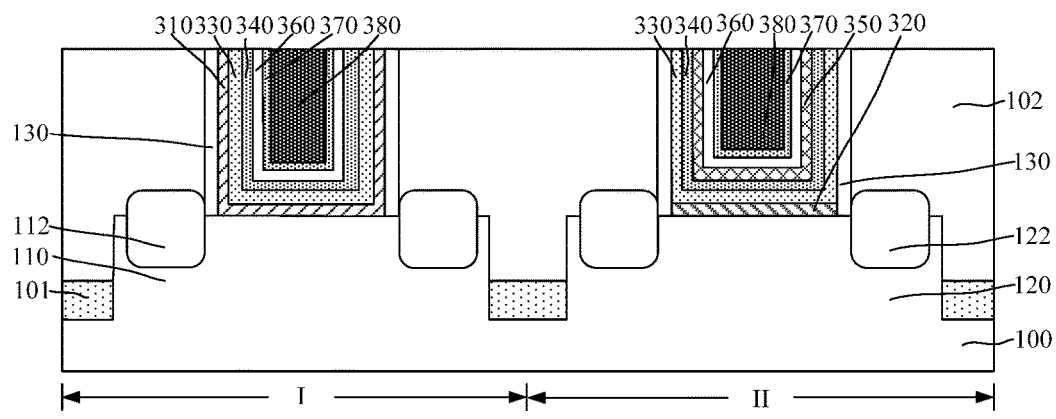
Figure 13:
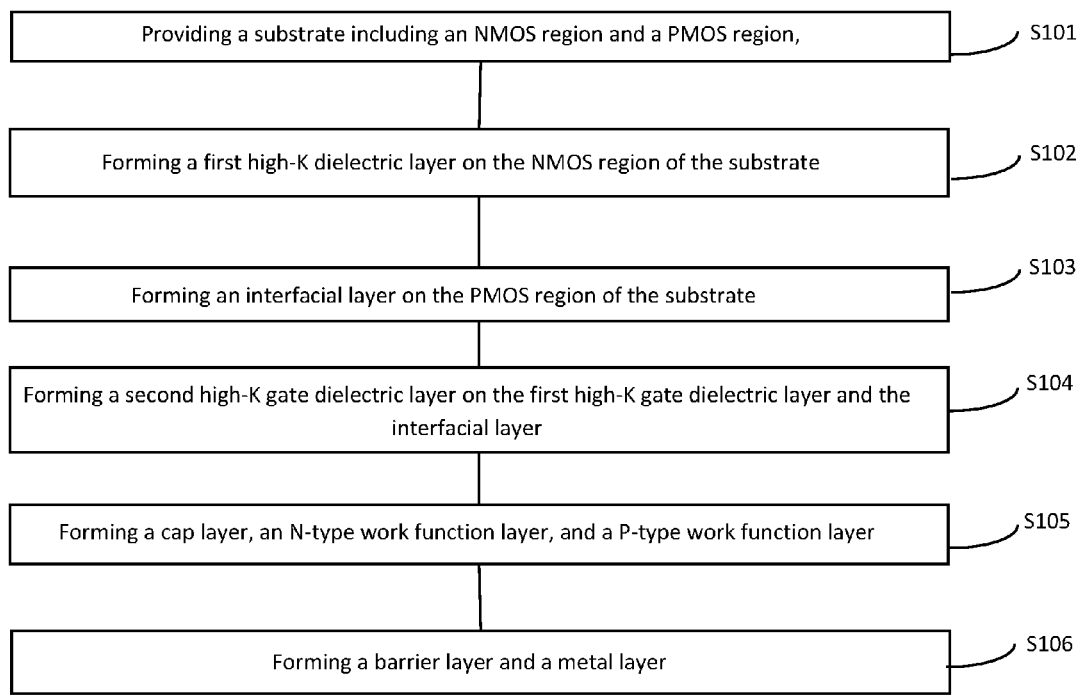
FIG. 13 illustrates an exemplary fabricating process of a semiconductor structure consistent with the disclosed embodiments.

FIG. 13 illustrates an exemplary fabrication process of a semiconductor structure consistent with the disclosed embodiments; and FIGS. 1~12 illustrate semiconductor structures corresponding to certain stages of the exemplary fabrication process consistent with the disclosed embodiments.

As shown in FIG. 13, at the beginning of the fabrication process, a substrate is provided (S101). FIG. 1 illustrates a corresponding semiconductor structure.

As shown in FIG. 1, a substrate (not shown) is provided, and the substrate includes an NMOS region I and a PMOS region II. The NMOS region I of the substrate is made of a Group III-V compound material, and the PMOS region II of the substrate is made of a germanium-containing material.

The NMOS region I of the substrate provides a processing platform for forming an N-type transistor, and the PMOS region II of the substrate provides a processing platform for forming a P-type transistor. In one embodiment, the NMOS region I and the PMOS region II are adjacent regions. In another embodiment, the NMOS region and the PMOS region may also be isolated or separated from each other.

The NMOS region I of the substrate can be made of a Group III-V compound material, and can be, for example, an indium gallium arsenide substrate, a gallium nitride substrate or a gallium arsenide substrate, to increase the carrier mobility of the N-type transistor. In one embodiment, the NMOS region I of the substrate is made of indium gallium arsenide, although any other appropriate material suitable for process requirements or for easy integration may be used for the NMOS region I of the substrate.

The PMOS region II of the substrate can be made of a germanium-containing material to increase the carrier mobility of the P-type transistor. In one embodiment, the PMOS region II of the substrate is a germanium substrate. In another embodiment, the PMOS region substrate may be a silicon germanium substrate, or a germanium-on-insulator substrate. The PMOS region II of the substrate may also be made of any other appropriate material suitable for process requirements or for easy integration.

In an exemplary embodiment, the substrate is used to form a fin field-effect transistor. For example, as shown in FIG. 1, the provided substrate may include a base substrate 100 and a plurality of discrete fins, including a first fin 110 and a second fin 120, on the base substrate 100. The fin on the NMOS region I of the base substrate 100 is the first fin 110, and the fin on the PMOS region II of the base substrate 100 is the second fin 120.

In other embodiments, the substrate may be a planar substrate, used to form a planar transistor.

For example, the base substrate 100 and the fins can be formed by the following process: providing an initial substrate; forming a patterned hard mask layer (not shown) on the surface of the initial substrate; etching the initial substrate using the hard mask layer as a mask. The etched initial substrate is used as the base substrate 100 having fins protruding from the surface of the base substrate 100.

In one embodiment, after forming the base substrate 100 and the fins, the hard mask layer on the top of the fins is retained. The hard mask layer is made of silicon nitride, and the top surface of the hard mask layer is used to define the stop position of a subsequent planarization process and to protect the top surface of the fins during the subsequent planarization process.

After forming the base substrate 100 and the fins, the disclosed fabrication method further includes forming an isolation structure 101 on regions of the base substrate 100 that are exposed by the fins. In other words, the isolation structure 101 is formed on a surface portion of the base substrate 100 between adjacent fins. The isolation structure 101 covers a portion of the sidewalls of the fins, and the top of the isolation structure 101 is lower than the top of the fin.

As an isolation structure of a semiconductor device, the isolation structure 101 is used to isolate adjacent devices. In one embodiment, the isolation structure 101 is made of silicon oxide. In other embodiments, the isolation structure may be made of silicon nitride or silicon oxynitride.

The isolation structure 101 is formed by the following process: filling the surface portions of the base substrate 100 exposed by fins with an isolation film, and the top of the isolation film being higher than the top of the hard mask layer (not shown); polishing to remove the isolation film above the top of the hard mask layer; etching back a partial thickness of the remaining isolation film, exposing the top surface of the fins and a portion of the sidewalls of the fins to form the isolation structure 101; and removing the hard mask layer.

As shown in FIG. 1, after forming the isolation structure 101, the fabrication method further includes: forming a first dummy gate structure 111 across the first fin 110 and a second dummy gate structure 121 across the second fin 120, with the first dummy gate structure 111 covering a portion of the top and sidewall surfaces of the first fin 110 and the second dummy gate structure 121 covering a portion of the top and sidewall surfaces of the second fin 120; forming a first source/drain doped region 112 within the first fin 110 on both sides of the first dummy gate structure 111 and forming a second source/drain doped region 122 within the second fin 120 on both sides of the second dummy gate structure 121; and forming an interlayer dielectric layer 102 on the base substrate 100, exposed by the first dummy gate structure 111 and the second dummy gate structure 121. The interlayer dielectric layer 102 exposes the top surfaces of the first dummy gate structure 111 and the second dummy gate structure 121.

The first dummy gate structure 111 occupies a spatial position for the gate structure of the subsequently formed N-type transistor, and the second dummy gate structure 121 occupies a spatial position for the gate structure of the subsequently formed P-type transistor. The first dummy gate structure 111 is a single layer structure or a stacked structure, and the second dummy gate structure 121 is a single layer structure or a stacked structure. The first dummy gate structure 111 may include a dummy gate layer and the second dummy gate structure 121 includes a dummy gate layer. The first dummy gate structure 111 may also include a dummy oxide layer and a dummy gate layer located on the dummy oxide layer, and the second dummy gate structure 121 includes a dummy oxide layer and a dummy gate layer on the dummy oxide layer. The dummy gate layer can be made of polysilicon, silicon oxide, silicon nitride, silicon oxynitride, silicon carbide, silicon carbonitride, silicon carbon oxynitride, or amorphous carbon. The dummy oxide layer can be made of silicon oxide or silicon oxynitride.

Specifically, the first dummy gate structure 111 and the second dummy gate structure 121 can be formed by following process: forming a dummy gate film on the substrate; patterning the dummy gate film to remove the dummy gate film on a portion of the substrate; and forming a first dummy gate structure 111 across the first fin 110 and forming a second dummy gate structure 121 across the second fin 120. In one embodiment, after forming the first dummy gate structure 111 and the second dummy gate structure 121, the sidewall 130 is also formed on the sidewall of the first dummy gate structure 111 and on the sidewall of the second dummy gate structure 121.

The sidewall 130 may be made of silicon oxide, silicon nitride, silicon carbide, silicon carbonitride, silicon oxynitride, silicon carbon oxynitride, boron nitride, or boron carbonitride. The sidewall 130 can be a single layer structure or a stacked structure. In one embodiment, the sidewall 130 is a single layer structure, and the sidewall 130 is made of silicon nitride.

In one embodiment, the dopant ions of the first source/drain doped region 112 are N-type ions, such as P, As or Sb ions, and the dopant ions of the second source/drain doped region 122 are P-type ions, such as B, Ga or In ions.

In one embodiment, the top of the interlayer dielectric layer 102 is leveled with the top of the first dummy gate structure 111 and the second dummy gate structure 121. The interlayer dielectric layer 102 can be formed by the following process: forming an interlayer dielectric film on the base substrate 100 exposed by the first dummy gate structure 111 and the second dummy gate structure 121, with the top of the interlayer dielectric film higher than the top of the first dummy gate structure 111 and the second dummy gate structure 121; and removing the interlayer dielectric film that is higher than the top of the first dummy gate structure 111 and the second dummy gate structure 121 to form the interlayer dielectric layer 102.

The interlayer dielectric layer 102 may be made of silicon oxide, silicon nitride, silicon oxynitride, or silicon carbon oxynitride. In one embodiment, the interlayer dielectric layer 102 can be made of a material different from the material of the first dummy gate structure 111 and the second dummy gate structure 121. For example, that is, the interlayer dielectric layer 102 can be made of silicon oxide.

Subsequently, an interfacial layer (IL) is formed on the PMOS region of the substrate, followed by forming a first high-K gate dielectric layer on the NMOS region of the substrate; and forming a second high-K gate dielectric layer on the interfacial layer in the PMOS region and the first high-K gate dielectric layer in the NMOS region.

Because the Group III-V compound material is difficult to be oxidized, in one embodiment, the interfacial layer is located only on the PMOS region II of the substrate but not on the NMOS region I of the substrate. As such, the stacked structure of the first high-K gate dielectric layer and the second high-K gate dielectric layer makes the gate dielectric layer of the device in the NMOS region I. The stacked structure of the interfacial layer (e.g., an oxide layer) and the second high-K gate dielectric layer makes the gate dielectric layer of the device in the PMOS region II. Correspondingly, the thickness of the first high-K gate dielectric layer and the thickness of the second high-K gate dielectric layer can affect the EOT of the gate dielectric layer in the NMOS region I, and the thickness of the interfacial layer and the thickness of the second high-K gate dielectric layer can affect the EOT of the gate dielectric layer in the PMOS region II.

To resolve the gate leakage current problem of the formed transistor, the thickness of the gate dielectric layer should not be too small and the EOT required for the PMOS region II is smaller than the EOT required for the NMOS region I. Therefore, in one embodiment, the gate leakage current problem can be simultaneously improved for the formed transistors in the NMOS region I and the PMOS region II by adjusting the thickness of the first high-K gate dielectric layer to satisfy performance requirements of the transistor in the NMOS region I after adjusting the thickness of the interfacial layer and the thickness of the second high-K gate dielectric layer to an extent satisfying the performance requirements of the transistor in the PMOS region II.

In the following, the detailed process to form the interfacial layer, the first high-K gate dielectric layer, and the second high-K gate dielectric layer will be explained along with the accompanying drawings.

Figure 2:
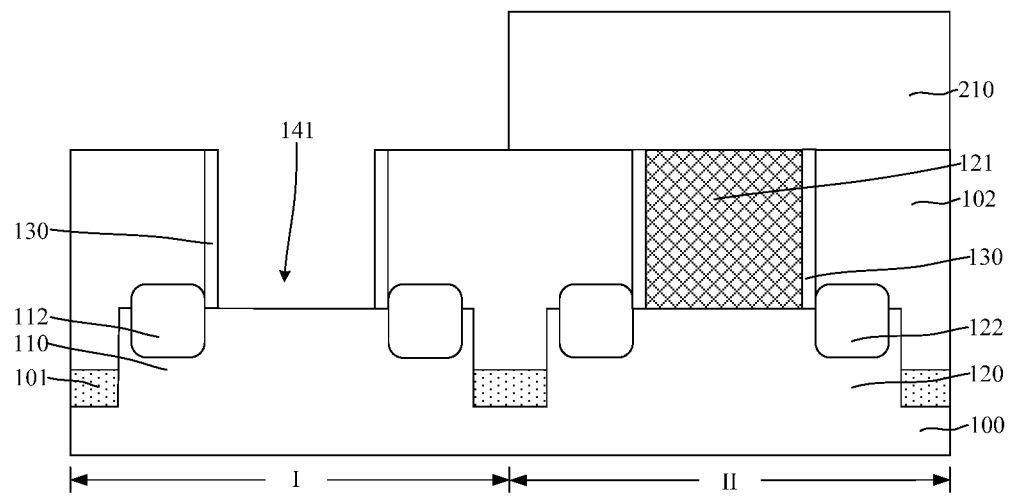
Figure 3:
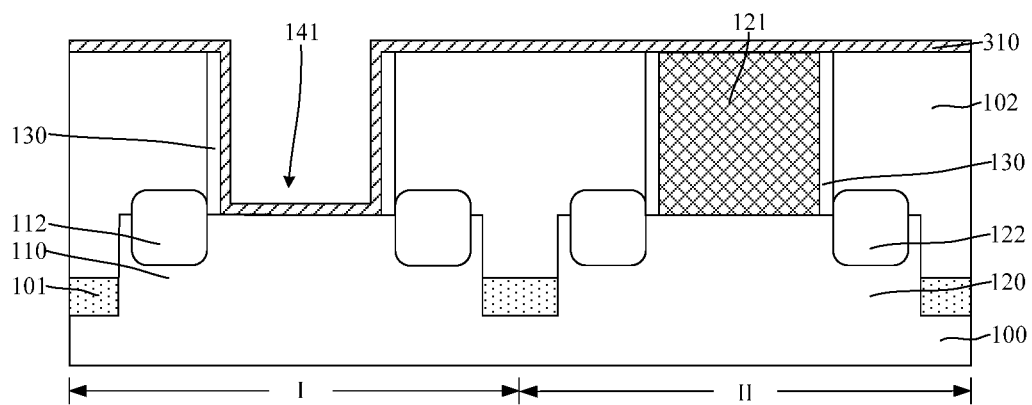
Figure 4:
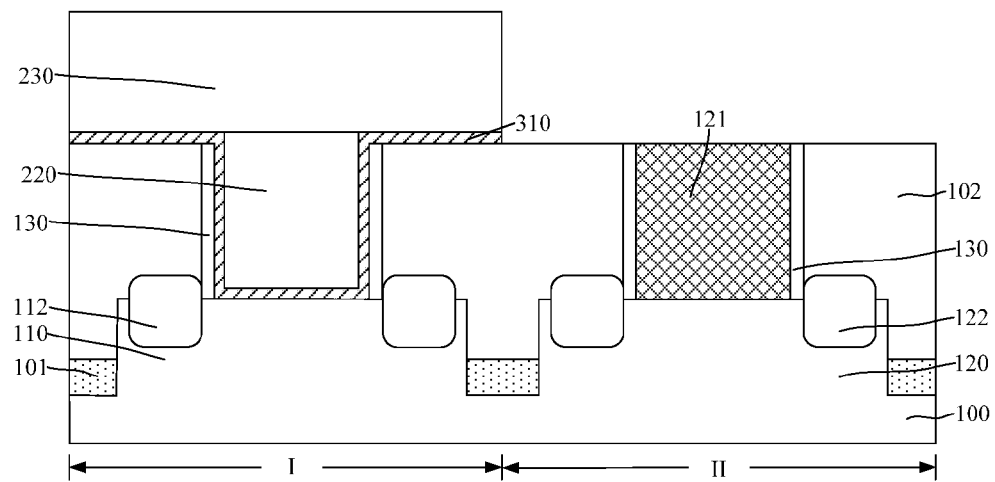

Returning to FIG. 13, after providing the substrate and the fins, a first high-K gate dielectric layer 310 is formed on the NMOS region I of the substrate (S102). FIGS. 2-4 illustrate semiconductor structures corresponding to certain stages of forming the first high-K gate dielectric layer 310 (FIG. 4) in the NMOS region I of the substrate.

The first high-K gate dielectric layer 310 provides a process basis for the subsequent formation of the gate dielectric layer of the transistor in the NMOS region I.

In one embodiment, the first high-K gate dielectric layer 310 is made of a high-K gate dielectric material, where the high-K gate dielectric material refers to a gate dielectric material having a relative permittivity greater than the relative permittivity of the silicon oxide.

The first high-K gate dielectric layer 310 may be formed by a chemical vapor deposition process, a physical vapor deposition process, or an atomic layer deposition process. In one embodiment, the first high-K gate dielectric layer 310 is made of $Al_2O_3$, and the process of forming the first high-K gate dielectric layer 310 is an atomic layer deposition process such that the first high-K gate dielectric layer 310 has desirable step coverage property. In other embodiments, the first high-K gate dielectric layer may be made of $HfO_2$, HfSiO, HfSiON, HfTaO, HfTiO, HfZrO, or $ZrO_2$.

The optimal thickness of the first high-K gate dielectric layer 310 depends on the performance requirements of the subsequently formed transistor in the NMOS region I. The thickness of the first high-K gate dielectric layer 310 should neither be too small nor too large. If the thickness of the first high-K gate dielectric layer 310 is too small, it is necessary to increase the thickness of the subsequently formed second high-K gate dielectric layer to improve the gate leakage current problem of the subsequently formed transistor in the NMOS region I, and as a result, the electrical performance of the transistor formed in the PMOS region II can be adversely affected. If the thickness of the first high-K gate dielectric layer 310 is too large, even though it is advantageous to improve the gate leakage current problem of the NMOS region I, the electrical performance of the transistor formed in the NMOS region I will decline. Thus, in one embodiment, the thickness of the first high-K gate dielectric layer 310 may be in the range of 10 Å~20 Å.

For example, the first high-K gate dielectric layer 310 can be formed according to the following process: forming a first patterned layer 210 (as shown in FIG. 2) covering the PMOS region II; using the first patterned layer 210 as a mask to remove the first dummy gate structure 111 (as shown in FIG. 1); forming a first opening 141 (as shown in FIG. 2) within the interlayer dielectric layer 102 in the NMOS region I exposing the first fin 110; removing the first patterned layer 210; and forming a first high-K gate dielectric layer 310 (as shown in FIG. 3) at the bottom and on the sidewalls of the first opening 141.

In one embodiment, the first patterned layer 210 is made of a photoresist. After forming the first high-K gate dielectric layer 310, the first patterned layer 210 is removed, for example, by a wet etching process or an ashing process.

In one embodiment, when forming the first high-K gate dielectric layer 310 on the NMOS region I of the substrate, the first high-K gate dielectric layer 310 spans the first fin 110 and covers a portion of the top surface and sidewall surface of the first fin 110. After forming the first high-K gate dielectric layer 310, the first high-K gate dielectric layer 310 also covers the top surface of the interlayer dielectric layer 102, the top of the sidewall 130 in the PMOS region II, and the top of the second dummy gate structure 121.

As shown in FIG. 4, the fabrication method further includes: forming a filling layer 220 that fills fully the first opening 141; forming a second patterned layer 230 on the first high-K gate dielectric layer 310 that is on the filling layer 220 and in the NMOS region I; using the second patterned layer 230 as a mask to remove the first high-K gate dielectric layer 310 in the PMOS region II.

The filling layer 220 provides a flat surface for forming the second patterned layer 230. The filling layer 220 is made of a material that is different from the material of the first high-K gate dielectric layer 310 and that can easily be removed, so that the process of removing the filling layer 220 does not damage the first high-K gate dielectric layer 310.

In one embodiment, the filling layer 220 is made of an organic dielectric layer (ODL) material, and the filling layer 220 is formed by a spin coating process, with the top of the filling layer 220 leveled with the top of the first high-K gate dielectric layer 310. In other embodiments, the filling layer may also be made of a bottom anti-reflective coating (BARC) material or a deep ultraviolet absorbing oxide (DUO) material, in which the DUO material is a silicone polymer material, including $CH_3$—SiOX, Si—OH, or $SiOH_3$. In other embodiments, the second patterned layer 230 may be made of a photoresist.

In one embodiment, after removing a portion of the first high-K gate dielectric layer 310 from the PMOS region II, the filling layer 220 and the second patterned layer 230 are retained, and the filling layer 220 and the second patterned layer 230 are used as an etching mask for subsequently removing the second dummy gate structure 121.

Figure 5:
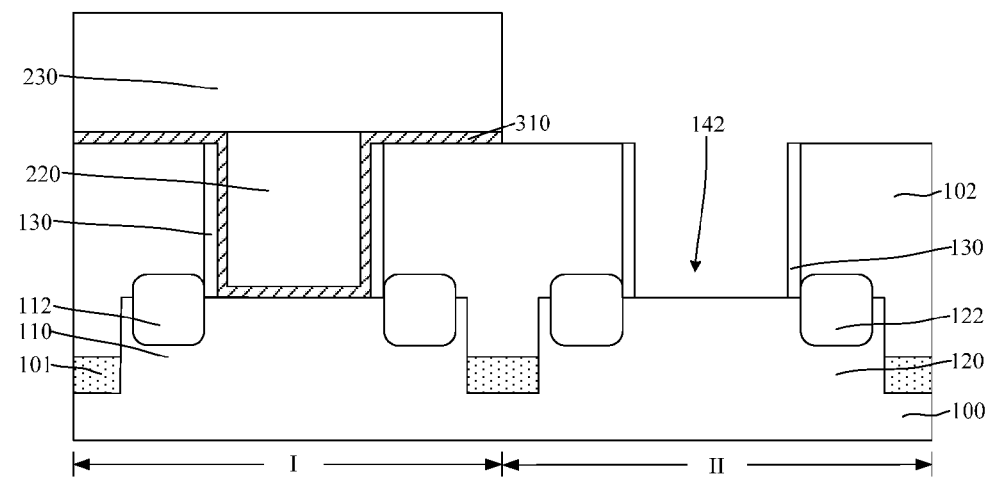
Figure 6:
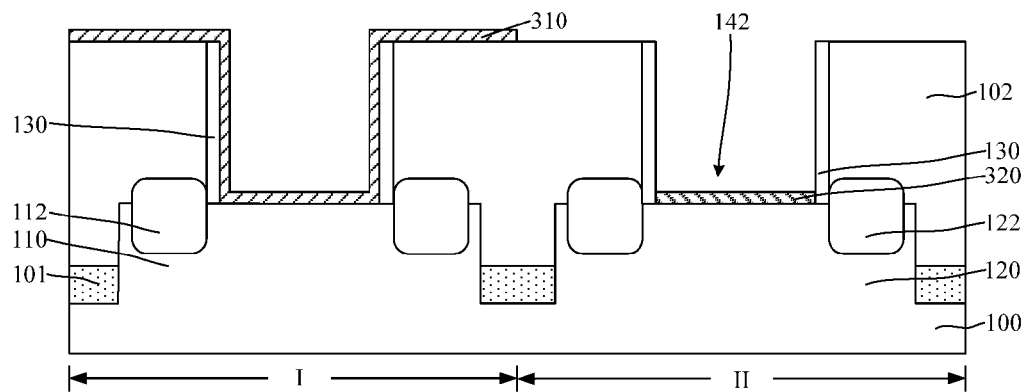

Returning to FIG. 13, after forming the first high-K gate dielectric layer 310 on the NMOS region I of the substrate, an interfacial layer is formed on the PMOS region II of the substrate (S103). As shown in FIGS. 5 and 6, an interfacial layer 320 is formed on the PMOS region II of the substrate by an oxidation process (FIG. 6).

In one aspect, the interfacial layer 320 may serve as a portion of the subsequently formed gate structure in the PMOS region II, together with the stacked structure formed by the second high-K gate dielectric layer, to make the gate dielectric layer of the PMOS region. Further, the interfacial layer 320 provides a good interfacial basis for subsequently forming the second high-K gate dielectric layer to improve the quality of the formed second high-K gate dielectric layer, reduce the degree of the interfacial state between the second high-K gate dielectric layer and the second fin 120, and avoid the adverse effect caused by the direct contact between the second high-K gate dielectric layer and the second fin 120.

For example, the interfacial layer 320 on the PMOS region II of the substrate can be formed by the following process: removing the second dummy gate structure 121 (FIG. 4) using the filling layer 220 and the second patterned layer 230 as a mask to form a second opening 142 (as shown in FIG. 5) within the interlayer dielectric layer 102 in the PMOS region II and exposing the second fin 120; removing the filling layer 220 and the second patterned layer 230; and forming an interfacial layer 320 at the bottom of the second opening 142 by an oxidation process.

In one embodiment, the second patterned layer 230 may be made of a photoresist, and the second patterned layer 230 may be removed by a wet etching process or an ashing process.

In one embodiment, the filling layer 220 is removed by a dry etching process. In particular, the etching gas employed in the dry etching process may include $CF_4$ or $CHF_3$. In other embodiments, the filling layer may also be removed by a wet etching process.

In one embodiment, the interfacial layer 320 is formed by an oxidation process. In other embodiments, the interfacial layer may also be formed using the chemical vapor deposition process, the physical vapor deposition process, or the atomic layer deposition process.

To improve the interfacial performance between the interfacial layer 320 and the second fin 120, the interfacial layer 320 is formed at the bottom of the second opening 142 using a thermal oxidation process. In other embodiments, the interfacial layer may also be formed using a wet oxidation process.

For example, when forming the interfacial layer 320 by the thermal oxidation process, an oxidizing gas may be introduced into the reaction chamber as an oxygen source. A silicon source may also be introduced into the reaction chamber to reduce the oxidation rate of the thermal oxidation process of the substrate. In one embodiment, the parameters of the thermal oxidation process include: the oxidizing gas may include $O_2$, $H_2O$, NO, or $N_2O$, the gas flow rate of the oxidizing gas may be in a range of about 10 sccm~100 sccm, and the chamber temperature may be in a range of about 500° C.~850° C.

Since the Group III-V compound material is difficult to be oxidized, the interfacial layer 320 can only be formed on the PMOS region II of the substrate. Further, the thermal oxidation process can only oxidize the exposed substrate. Therefore, in one embodiment, the thermal oxidation process only oxidizes the material of the second fin 120 exposed by the second opening 142, and the interfacial layer 320 is formed only at the bottom of the second opening 142. In addition, the PMOS region II of the substrate may be made of a germanium substrate, i.e. the second fin 120 may be made of germanium, and the interfacial layer 320 may be made of germanium oxide.

The thickness of the interfacial layer 320 should not be too thin, otherwise the effect of the interfacial layer 320 for improving the interfacial performance is not effective. The optimal thickness of the interfacial layer 320 is determined according to the process requirements and the thickness of the subsequently formed second high-K gate dielectric layer. In one embodiment, the thickness of the interfacial layer 320 may be in a range of about 6 Å~10 Å.

In one embodiment, the first high-K gate dielectric layer 310 is formed first, followed by formation of the interfacial layer 320. In other embodiments, the interfacial layer may also be formed before forming the first high-K gate dielectric layer.

Figure 7:
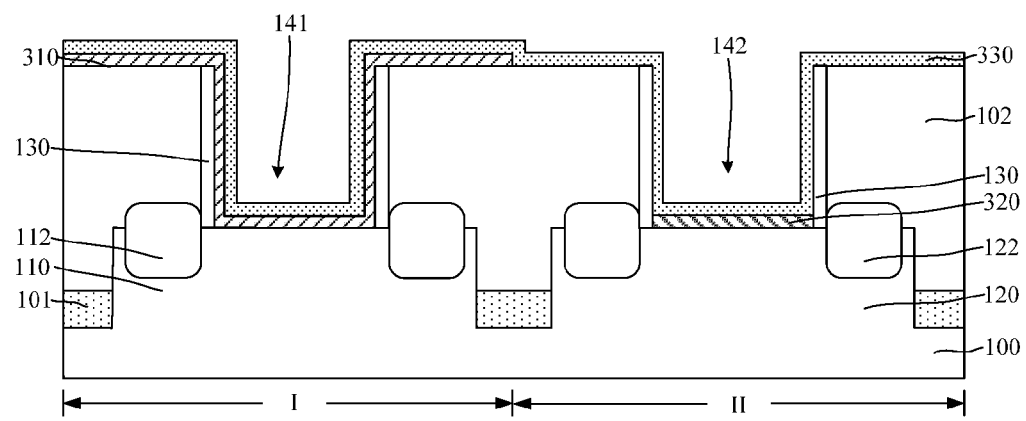

Returning to FIG. 13, the fabrication method further includes forming a second high-K gate dielectric layer on the first high-K gate dielectric layer and the interfacial layer (S104). FIG. 7 illustrates a corresponding semiconductor structure.

As shown in FIG. 7, a second high-K gate dielectric layer 330 is formed on the first high-K gate dielectric layer 310 and the interfacial layer 320.

The stacked structure of the first high-K gate dielectric layer 310 and the second high-K gate dielectric layer 330 on the NMOS region I of the substrate is used as a gate dielectric layer of the transistor formed in the NMOS region I. The stacked structure of the interfacial layer 320 and the second high-K gate dielectric layer 330 on the PMOS region II of the substrate is used as a gate dielectric layer of the transistor formed in the PMOS region II. Thus, the EOT of the transistor formed n the NMOS region I is affected by the first high-K gate dielectric layer 310 and the second high-K gate dielectric layer 330, and the EOT of the transistor formed in the PMOS region II is affected by the interfacial layer 320 and the second high-K gate dielectric layer 330.

In one embodiment, the second high-K gate dielectric layer 330 is made of $ZrO_2$. $ZrO_2$ has a high dielectric constant, and therefore, while the EOT of the second high-K gate dielectric layer 330 satisfying the process requirements, the physical thickness of the second high-K gate dielectric layer 330 is still very small, beneficial for improving the integration degree of the formed semiconductor structure and improving the gate leakage current problem of the NMOS region I and the PMOS region II. In other embodiments, the second high-K gate dielectric layer may be made of $HfO_2$, HfSiO, HfSiON, HfTaO, HfTiO, HfZrO or $Al_2O_3$.

The thickness of the second high-K gate dielectric layer 330 can be determined by the process requirements. In one embodiment, the thickness of the second high-K gate dielectric layer 330 is in a range of about 10 Å~20 Å.

In one embodiment, when forming the second high-K gate dielectric layer 330 on the first high-K gate dielectric layer 310 and the interfacial layer 320, the second high-K gate dielectric layer 330 spans the second fin 120 and covers a portion of the top surface and sidewall surface of the second fin 120, and the second high-K gate dielectric layer 330 is also located on the sidewall surface of the second opening 142.

Details of the second high-K gate dielectric layer 330 can be similarly referred to the foregoing description of the first high-K gate dielectric layer 310 and will not be described here.

Figure 8:
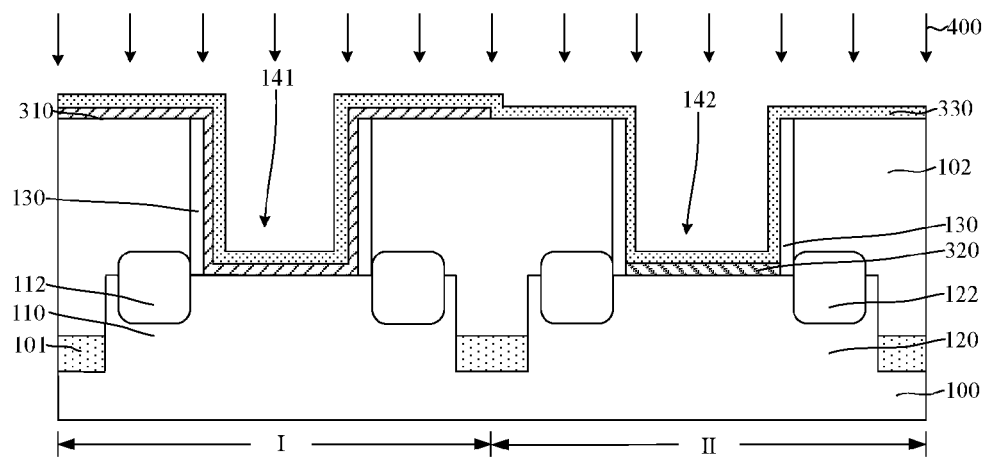

After forming the second high-K gate dielectric layer 330, the fabrication method further includes annealing (400) the substrate. FIG. 8 illustrates a corresponding semiconductor structure.

The annealing process 400 is used to repair the interfacial layer 320, the first high-K gate dielectric layer 310, and the second high-K gate dielectric layer 330 to increase the density of the interfacial layer 320, the first high-K gate dielectric layer 310, and the second high-K gate dielectric layer 330.

In one embodiment, the annealing process 400 may be a spike annealing process or a laser annealing process. To achieve the desired processing result of increasing the density of the interfacial layer 320, the first high-K gate dielectric layer 310 and the second high-K gate dielectric layer 330, and to avoid the adverse effect on the distribution of the dopant ions within the substrate, the parameters of the annealing process 400 need to be controlled within a reasonable range. In one embodiment, the parameters of the spike annealing process include an annealing temperature in the range of about 850° C.~900° C. and a pressure of about one standard atmospheric pressure. In another example, the parameters of the laser annealing process include an annealing temperature in the range of about 900° C.~1000° C. and a pressure of about one standard atmospheric pressure.

In other embodiments, the annealing process for the substrate may further include spike annealing the substrate; and, after completion of the spike annealing process, the substrate is subjected to laser annealing. The passivation of dopant ions can be avoided by first performing a low temperature spike annealing process, followed by a high temperature laser annealing process.

Figure 9:
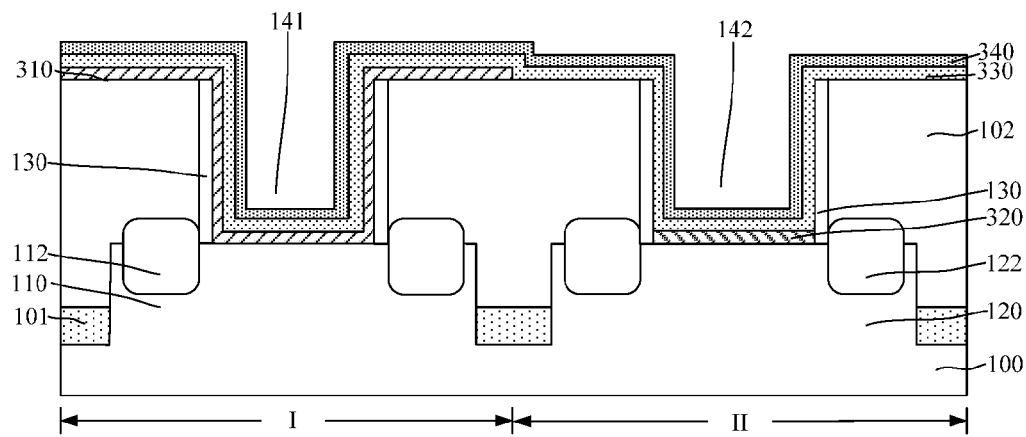
Figure 10:
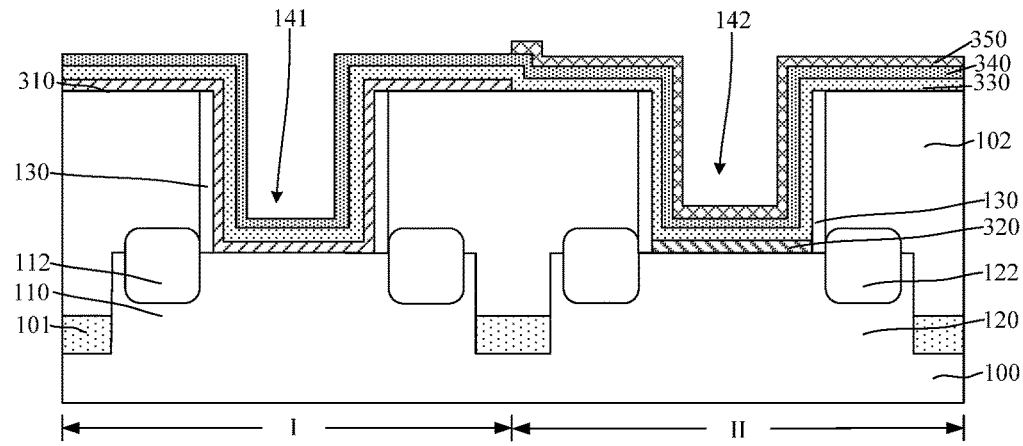

Returning to FIG. 13, after forming the second high-K gate dielectric layer 330, the fabrication method further includes forming a cap layer, an N-type work function layer, and a P-type work function layer (S105). FIGS. 9-11 illustrate corresponding semiconductor structures.

After forming the second high-K gate dielectric layer 330, an N-type work function layer is formed on the second high-K gate dielectric layer 330 in the NMOS region I, and a P-type work function layer is formed on the second high-k gate dielectric layer 330 in the PMOS region II.

In one embodiment, the P-type work function layer is formed before formation of the N-type work function layer. In other embodiments, the N-type work function layer may be formed first, followed by the P-type work function layer.

As shown in FIG. 9, in order to protect the gate dielectric layer of the NMOS region I and the gate dielectric layer of the PMOS region II and avoid the diffusion of the metal ions in the P-type work function layer or the N-type work function layer into corresponding gate dielectric layer, after forming the second high-K gate dielectric layer 330 and before forming the N-type work function layer and the P-type work function layer, the fabrication method further includes forming a cap layer 340 on the second high-K gate dielectric layer 330.

In one embodiment, the cap layer 340 is made of TiN, and the cap layer 340 may be formed by an atomic layer deposition process. In other embodiments, the cap layer may also be made of TiSiN, TaN or TaSiN, and may also be formed by a physical vapor deposition process or a chemical vapor deposition process.

As shown in FIG. 10, a P-type work function layer 350 is formed on the second high-K gate dielectric layer 330 in the PMOS region II.

The P-type work function layer 350 is used to adjust the threshold voltage of the P-type transistor. The P-type work function layer 350 is made of a P-type work function material, and the work function of the P-type work function material is in the range of about 5.1 eV~5.5 eV, such as about 5.2 eV, 5.3 eV, or 5.4 eV. The P-type work function layer 350 may be made of one or more of TiN, TaN, TaSiN and TiSiN, and the P-type work function layer may be formed using a chemical vapor deposition process, a physical vapor deposition process, or an atomic layer deposition process.

In one embodiment, the P-type work function layer 350 is made of TiN, and the P-type work function layer 350 is formed by the atomic layer deposition process, so that the P-type work function layer 350 has desirable step coverage property.

The cap layer 340 is formed on the second high-K gate dielectric layer 330 of the PMOS region II, and therefore the P-type work function layer 350 is located on the cap layer 340 in the PMOS region II.

The P-type work function layer 350 can be formed by the following process: forming a P-type work function layer 350 on the cap layer 340. The P-type work function layer 350 is not only located on the cap layer 340 of the PMOS region II, but also on the cap layer 340 of the NMOS region I. The P-type work function layer 350 of the NMOS region I is removed and the P-type work function layer 350 located on the cap layer 340 in the PMOS region II is retained.

As shown in FIG. 11, an N-type work function layer 360 is formed on the second high-K gate dielectric layer 330 of the NMOS region I.

The N-type work function layer 360 is used to adjust the threshold voltage of the N-type transistor. The N-type work function layer 360 is made of an N-type work function material, and the work function of the N-type work function material is in a range of about 3.9 eV~4.5 eV, such as about 4 eV, 4.1 eV, or 4.3 eV. The N-type work function layer 360 may be made of one or more of TiAl, TiAlC, TaAlN, TiAlN, TaCN and AlN, and the N-type work function layer 360 may be formed using a chemical vapor deposition process, a physical vapor deposition process, or an atomic layer deposition process.

In one embodiment, the N-type work function layer 360 is made of TiAl, and the N-type work function layer 360 is formed by the atomic layer deposition process. The N-type work function layer 360 covers the P-type work function layer 350, and the N-type work function layer 360 has desirable step coverage property.

Since the cap layer 340 is formed on the second high-K gate dielectric layer 330 of the NMOS region I, the N-type work function layer 360 is located on the cap layer 340 of the NMOS region I.

In one embodiment, after forming the N-type work function layer 360, the N-type work function layer 360 on the P-type work function layer 350 is retained to reduce the processing difficulties and save the optical masks.

Returning to FIG. 13, the fabrication method further includes forming a barrier layer and a metal layer (S106). FIGS. 11-12 illustrate corresponding semiconductor structures.

After forming the N-type work function layer 360, a barrier layer 370 is formed on the N-type work function layer 360 (FIG. 11).

The subsequently formed metal layer typically contains diffusive ions (e.g., F ions) and the barrier layer can block the diffusion of the diffusive ions into the N-type work function layer 360 or even into the P-type work function layer 350. Therefore, the possibility of increasing the work function of the N-type work function layer 360 is reduced, and the increase of the work function of the P-type work function layer 350 becomes less possible.

In one embodiment, the barrier layer 370 is made of TiN. The barrier layer 370 is formed by an atomic layer deposition process, and the formed barrier layer 370 has a desirable step coverage property. In other embodiments, the barrier layer may be made of TiSiN, TaN or TaSiN, and may be formed by a physical vapor deposition process or a chemical vapor deposition process.

As shown in FIG. 12, a metal layer 380 is formed on the second high-K gate dielectric layer 330. The first high-K gate dielectric layer 310, the second high-K gate dielectric layer 330, and the metal layer 380 in the NMOS region I are used to form a first gate structure (not labeled), and the interfacial layer 320, the second high K gate dielectric layer 330, and the metal layer 380 in the PMOS region II are used to form a second gate structure (not labeled).

In one embodiment, the metal layer 380 is made of W. In other embodiments, the metal layer may be made of Al, Cu, Ag, Au, Pt, Ni or Ti.

For example, the metal layer 380 can be formed by the following process: filling a metal material in the first opening 141 (FIG. 11) and the second opening 142 (FIG. 11), with the metal material also covering the top surface of the N-type work function layer 360; removing the metal material at the top of the interlayer dielectric layer 102 by a planarization process, the remaining metal material forming a metal layer 380; and removing the N-type work function layer 360, the P-type work function layer 350, the second high-K gate dielectric layer 330, and the first high-K gate dielectric layer 310 on top of the interlayer dielectric layer 102.

As the barrier layer 370 is formed on the top surface of the N-type work function layer 360, the metal material covers the top surface of the barrier layer when filling with the metal. In addition, the cap layer 340 is formed on the top of the second high-K gate dielectric layer 330, so that the cap layer 340 and the barrier layer 370 on the top of the interlayer dielectric layer 102 are also removed during the planarization process. In one embodiment, the planarization process is a chemical mechanical polishing (CMP) process.

Thus, the first gate structure includes the first high-K gate dielectric layer 310, the second high-K gate dielectric layer 330, the cap layer 340, the N-type work function layer 360, the barrier layer 370, and the metal layer 380 in the first opening 141; the second gate structure includes the second high-K gate dielectric layer 330, the cap layer 340, the P-type work function layer 350, the N-type work function layer 360, the barrier layer 370, and the metal layer 380 in the second opening 142.

In one embodiment, the Group III-V compound material is difficult to be oxidized when forming the interfacial layer. As a result, the interfacial layer is formed only on the PMOS region of the substrate, and the interfacial layer exerts an effect on the EOT of the transistor formed in the PMOS region. By adjusting the thickness of the interfacial layer and the second high-K gate dielectric layer, the gate leakage current problem of the PMOS region can be resolved if the thickness of the stacked structure including the interfacial layer and the second high-K gate dielectric layer is sufficient. In the present disclosure, the gate leakage current problem of the NMOS region and the PMOS region is simultaneously resolved.

Before forming the second high-K gate dielectric layer, a first high-K gate dielectric layer is formed on the NMOS region of the substrate, so that the thickness of the first high-K gate dielectric layer can be adjusted such that the EOT of the transistor formed in the NMOS region is sufficient to improve the NMOS region gate leakage current problem on the basis that the gate leakage current problem in the PMOS region is improved by adjusting the thickness of the second high-K gate dielectric layer. Compared with conventional technology, the present disclosure avoids the adverse effect on the electrical performance of the transistor in the PMOS region when the thickness of the second high-K gate dielectric layer satisfies performance requirements of the transistor formed in the NMOS region.

Accordingly, the present disclosure also provides a semiconductor structure. As shown in FIG. 12, the semiconductor structure includes:

a substrate including an NMOS region I and a PMOS region II, with the NMOS region I of the substrate being made of a Group III-V compound material, and the PMOS region II of the substrate being made of a germanium-containing material;

a first gate structure (not labeled) on the NMOS region I of the substrate, with the first gate structure including a first high-K gate dielectric layer 310 on the NMOS region I of the substrate, a second high-k gate dielectric layer 330 on the first high-K gate dielectric layer 310, and a metal layer 380 on the second high-K gate dielectric layer 330;

a second gate structure (not labeled) on the PMOS region II of the substrate, with the second gate structure including an interfacial layer 320 on the PMOS region II of the substrate, a second high-K gate dielectric layer 330 on the interfacial layer 320, and a metal layer 380 on the second high-K gate dielectric layer 330.

In one embodiment, the semiconductor structure on the NMOS region I of the substrate is an N-type transistor, and the semiconductor structure on the PMOS region II of the substrate is a P-type transistor.

In one embodiment, the NMOS region I and the PMOS region II are adjacent regions. In other embodiments, the NMOS region and the PMOS region may also be isolated from each other.

The NMOS region I of the substrate can include a Group III-V compound substrate, such as an indium gallium arsenide substrate, a gallium nitride substrate or a gallium arsenide substrate, to increase the carrier mobility of the N-type transistor. In one embodiment, the NMOS region I of the substrate is made of indium gallium arsenide. The NMOS region I of the substrate may also be made of an appropriate material suitable for processing requirements or for easy integration.

The PMOS region II of the substrate can include a germanium-containing substrate to increase the carrier mobility of the P-type transistor. In one embodiment, the PMOS region II of the substrate can include a germanium substrate. In other embodiments, the PMOS region II of the substrate may also be made of silicon germanium, or may be a germanium-on-insulator substrate. The PMOS region II of the substrate may also be made of an appropriate material suitable for processing requirements or for easy integration.

In one embodiment, the semiconductor structure is a fin-type field effect transistor. The substrate includes a base substrate 100 and a plurality of discrete fins, including a first fin 110 and a second fin 120, on the base substrate 100. The fin located on the NMOS region I of the substrate 100 is the first fin 110, and the fin located on the PMOS region II of the substrate 100 is the second fin 120.

Correspondingly, the first gate structure spans the first fin 110 and covers a portion of the top surface and sidewall surface of the first fin 110, and the second gate structure spans the second fin 120 and covers a portion of the top and sidewall surfaces of the second fin 120.

In other embodiments, the semiconductor structure may also be a planar transistor, and the corresponding substrate is a planar substrate. Correspondingly, the first gate structure and the second gate structure are located on the planar substrate.

The semiconductor structure further includes an isolation structure 101 located on the substrate 100 between adjacent fins. The isolation structure 101 covers a portion of the sidewalls of the fins, and the top of the isolation structure 101 is below the top of the fins.

As an isolation structure for a semiconductor device, the isolation structure 101 is used to isolate adjacent devices. In one embodiment, the isolation structure 101 is made of silicon oxide. In other embodiments, the isolation structure may also be made of silicon nitride or silicon oxynitride.

The semiconductor structure further includes: a sidewall 130 located on the sidewall of the first gate structure and the sidewall of the second gate structure; a first source/drain doped region 112 located within the first fin 110 on both sides of the first gate structure; a second source/drain doped region 122 located within the second fin 120 on both sides of the second gate structure; an interlayer dielectric layer 102 covering the first source/drain doped region 112 and the second source/drain doped region 122, and the interlayer dielectric layer 102 also covers the sidewall of the first gate structure and the sidewall of the second gate structure.

The sidewall 130 may be made of silicon oxide, silicon nitride, silicon carbide, silicon carbonitride, silicon oxynitride, silicon carbon oxynitride, boron nitride, or boron carbonitride. The sidewall may be a layered structure or stacked structure. In one embodiment, the sidewall 130 is a single layer structure, and the sidewall 130 is made of silicon nitride.

In one embodiment, the dopant ions of the first source/drain doped region 112 are N-type ions, such as P, As or Sb, and the dopant ions of the second source/drain doped region 122 are P-type ions, such as B, Ga or In.

In one embodiment, the top of the interlayer dielectric layer 102 is leveled with the top of the first gate structure and the second gate structure, and the interlayer dielectric layer 102 is made of silicon oxide. In other embodiments, the interlayer dielectric layer may also be made of silicon nitride, silicon oxynitride, or silicon carbon oxynitride.

In one embodiment, the roles of the interfacial layer 320 can include as follows: on the one hand, as a portion of the second gate structure, for example, the stacked layer including the interfacial layer 320 and the second high-K gate dielectric layer 330 makes the gate dielectric layer of the PMOS region II. On the other hand, the interfacial layer 320 provides a desirable interfacial basis for forming the second high-K gate dielectric layer 330, therefore improving the quality of the second high-K gate dielectric layer 330, reducing the degree of the interfacial state between the second high-K gate dielectric layer 330 and the second fin 120, and preventing the adverse effect due to the direct contact between the second high-K gate dielectric layer 330 and the second fin 120.

To improve the interfacial properties between the interfacial layer 320 and the second fin 120, the interfacial layer 320 is formed by an oxidation process. In an example that the PMOS region II of the substrate is a germanium substrate, the interfacial layer 320 is made of germanium oxide.

The interfacial layer 320 should not be too thin, otherwise the effect of the interfacial layer 320 on improving the interfacial performance is not significant. The thickness of the interfacial layer 320 can be determined according to the process requirements and the thickness of the second high-K gate dielectric layer 330. In one embodiment, the thickness of the interfacial layer 320 is in a range of about 6 Å~10 Å.

In one embodiment, the first high-K gate dielectric layer 310 and the second high-K gate dielectric layer 330 are made of a high-K gate dielectric material, in which the high-K gate dielectric material refers to a gate dielectric material having a relative permittivity greater than the relative permittivity of silicon oxide.

In one embodiment, the first high-K gate dielectric layer 310 is made of $Al_2O_3$. In other embodiments, the first high-K gate dielectric layer may be made of $HfO_2$, HfSiO, HfSiON, HfTaO, HfTiO, HfZrO or $ZrO_2$.

In one embodiment, the second high-K gate dielectric layer 330 can be made of $ZrO_2$ that has a high dielectric constant. As such, the physical thickness of the second high-K gate dielectric layer 330 can remain relatively small while the EOT of the second high-K gate dielectric layer 330 satisfying the process requirements. Correspondingly, the integrated degree of the formed semiconductor structure can be improved and the gate leakage current problem in the NMOS region I and PMOS region II can be resolved. In other embodiments, the second high-K gate dielectric layer may also be made of $HfO_2$, HfSiO, HfSiON, HfTaO, HfTiO, HfZrO or $Al_2O_3$.

The thickness of the first high-K gate dielectric layer 310 is dependent on the performance requirements of the transistor in the NMOS region I. The thickness of the first high-K gate dielectric layer 310 should neither be too small nor too large. If the thickness of the first high-K gate dielectric layer 310 is too small, the thickness of the second high-K gate dielectric layer 330 should be increased so as to improve the gate leakage current problem of the transistor in the NMOS region I, adversely affecting the electrical performance of the transistor in the PMOS region. If the thickness of the first high-K gate dielectric layer 310 is too large, even though it is advantageous to improve the gate leakage current problem of the transistor in the NMOS region I, the electrical performance of the transistor in the NMOS region I may decrease. Therefore, in one embodiment, the thickness of the first high-K gate dielectric layer 310 is in a range of 10 Å~20 Å.

The thickness of the second high-K gate dielectric layer 330 may be determined according to the process requirements. In one embodiment, the thickness of the second high-K gate dielectric layer 330 is in a range of 10 Å~20 Å.

In one embodiment, the metal layer 380 is made of W. In other embodiments, the the metal layer may also be made of Al, Cu, Ag, Au, Pt, Ni or Ti.

In one embodiment, the first gate structure further includes an N-type work function layer 360 located between the second high-K gate dielectric layer 330 and the metal layer 380 of the NMOS region I, and the second gate structure further includes a P-type work function layer 350 located between the second high-K gate dielectric layer 330 and the metal layer 380 of the PMOS region II.

The P-type work function layer 350 is used to adjust the threshold voltage of the P-type transistor. The P-type work function layer 350 is made of a P-type work function material. The work function of the P-type work function material is in the range of 5.1 eV~5.5 eV, such as 5.2 eV, 5.3 eV, or 5.4 eV. The P-type work function layer 350 may be made of one or more of TiN, TaN, TaSiN and TiSiN. In one embodiment, the P-type work function layer 350 is made of TiN.

The N-type work function layer 360 is used to adjust the threshold voltage of the N-type transistor. The N-type work function layer 360 is made of an N-type work function material, and the work function of the N-type work function material is in a range of 3.9 eV~4.5 eV, such as 4 eV, 4.1 eV, or 4.3 eV. The N-type work function layer 360 may be made of one or more of TiAl, TiAlC, TaAlN, TiAlN, TaCN, and AlN. In one embodiment, the N-type work function layer 360 is made of TiAl.

The present disclosure provides a semiconductor structure including a first gate structure on the NMOS region of the substrate and a second gate structure on the PMOS region of the substrate. The first gate structure includes a first high-K gate dielectric layer and a second high-K gate dielectric layer on the first high-K gate dielectric layer, and the second gate structure includes an interfacial layer and a second high-K gate dielectric layer on the interfacial layer. The thickness of the first high-K gate dielectric layer and the thickness of the second high-K gate dielectric layer can affect the EOT of the transistor formed in the NMOS region, and the thickness of the interfacial layer and the thickness of the second high-K gate dielectric layer can affect the EOT of the transistor formed in the PMOS region. Therefore, on the basis of adjusting the thickness of the second high-K gate dielectric layer to an extent sufficient to solve the gate leakage current problem of the PMOS region, the present disclosure further improves the gate leakage current problem in the NMOS region by adjusting the thickness of the first high-K gate dielectric to make the thickness of the EOT of the transistor formed in the NMOS region sufficient. Compared to prior art that the first gate structure includes only the second high-K gate dielectric layer and that the second gate structure includes both the interfacial layer and the second high-K gate dielectric layer, the present disclosure avoids the adverse effect on the electrical performance of the transistor in the PMOS region when making the thickness of the second high-K gate dielectric layer satisfying the performance requirements of the transistor in the NMOS region.

In one embodiment, the NMOS region may include a substrate made of a Group III-V compound material, such as InGaAs, which may be used as an NMOS channel region for the formed NMOS transistor. The PMOS region may include a substrate made of a germanium-containing material such as Ge, used as a PMOS channel region for the formed NMOS transistor. In one embodiment, the first high-K gate dielectric layer may be made of $Al_2O_3$, and the second high-K gate dielectric layer may be made of $ZrO_2$. The interfacial layer may be made of $GeO_2$.

Compared with conventional technology, the fabrication method in the present disclosure is advantageous. For example, in the present disclosure, when forming the interfacial layer, the interfacial layer is formed only on the PMOS region of the substrate as the III-V compound material is difficult to be oxidized. As a result, the interfacial layer exerts an effect on the EOT of the transistor formed in the PMOS region. The thickness of the stacked structure formed by the interfacial layer and the second high-K gate dielectric layer is sufficient to resolve the gate leakage current problem of the PMOS region by adjusting the thickness of the interfacial layer and the second high-K gate dielectric layer. To simultaneously resolve the gate leakage current problem in the NMOS region and the PMOS region, in the present disclosure a first high-K gate dielectric layer is formed on the NMOS region of the substrate before forming the second high-K gate dielectric layer. Therefore, on the basis that the thickness of the second high-K gate dielectric layers is adjusted to be sufficient to resolve the gate leakage current problem in the PMOS region, the thickness of the first high-K gate dielectric layer can also be adjusted, so that the EOT of the transistor formed in the NMOS region is sufficient to resolve the gate leakage current problem in the NMOS region. Compared to conventional technology, the present disclosure avoids the adverse effect on the electric performance of the transistor in PMOS region when the thickness of the second high-K gate dielectric layer is adjusted to satisfy the performance requirements of the transistor in NMOS region.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
   providing a substrate including an NMOS region and a PMOS region;
   forming a first high-K gate dielectric layer on the NMOS region of the substrate and exposing the PMOS region of the substrate;
   forming an interfacial layer on the PMOS region of the substrate and exposing the first high-K gate dielectric layer;
   forming a second high-K gate dielectric layer on the interfacial layer and the first high-K gate dielectric layer; and
   forming a metal layer on the second high-K gate dielectric layer.

2. The method according to claim 1, wherein:
   the substrate including a Group III-V compound substrate for the NMOS region and a germanium-containing substrate for the PMOS region.

3. The method according to claim 1, wherein:
   the first high-K gate dielectric layer is made of at least one of $HfO_2$, HfSiO, HfSiON, HfTaO, HfSiO, HfZrO, $ZrO_2$ and $Al_2O_3$, and
   the second high-K gate dielectric layer is made of at least one of $HfO_2$, HfSiO, HfSiON, HfTaO, HfSiO, HfZrO, $ZrO_2$ and $Al_2O_3$.

4. The method according to claim 1, wherein:
   the first high-K gate dielectric layer has a thickness in a range of about 10 Å~20 Å,
   the interfacial layer has a thickness in a range of about 6 Å~10 Å and
   the second high-K gate dielectric layer has a thickness in a range of about 10 Å~20 Å.

5. The method according to claim 1, wherein forming the interfacial layer includes:
   an oxidation process including a thermal oxidation process or a wet oxidation process.

6. The method according to claim 5, wherein parameters of the thermal oxidation process include:
   an oxidizing gas of $O_2$ $H_2O$, NO or $N_2O$,
   a gas flow rate of the oxidizing gas in a range of about 10 sccm to about 100 sccm, and
   a chamber temperature in a range of about 500° C.~850° C.

7. The method according to claim 1, wherein:
   the interfacial layer is made of germanium oxide.

8. The method according to claim 1, wherein:
   after forming the second high-K gate dielectric layer and before forming the metal layer on the second high-K gate dielectric layer, the substrate is annealed.

9. The method for according to claim 8, wherein:
   the substrate is annealed by a spike annealing, a laser annealing process, or a combination thereof.

10. The method according to claim 9, wherein:
    the spike annealing process includes an annealing temperature of about 850° C.~900° C. and an annealing pressure of about one standard atmospheric pressure.

11. The method according to claim 9, wherein:
    the laser annealing process includes an annealing temperature of about 900° C.~1000° C. and an annealing pressure of about one standard atmospheric pressure.

12. The method according to claim 1, wherein:
    the substrate includes a base substrate and a plurality of discrete fins on the base substrate,
    the plurality of discrete fins includes a first fin for the NMOS region and a second fin for the PMOS region, and
    the first fin is made of a Group III-V compound material and the second fin is made of a germanium-containing material.

13. The method according to claim 12, after providing the substrate and before forming the first high-K gate dielectric layer and the interfacial layer, further including:
    forming a first dummy gate structure across the first fin and a second dummy gate structure across the second fin,
    forming a first source/drain doped region in the first fin on both sides of the first dummy gate structure and forming a second source/drain doped region in the second fin on both sides of the second dummy gate structure, and forming an interlayer dielectric layer on the substrate exposed by the first dummy gate structure and the second dummy gate structure, the interlayer dielectric layer exposing a top of the first dummy gate structure and the second dummy gate structure, wherein:

the first high-K gate dielectric layer formed on the NMOS region of the substrate spans the first fin and covers a portion of top and sidewall surfaces of the first fin, and the second high-K gate dielectric layer formed on the interfacial layer and the first high-K gate dielectric layer spans the second fin and covers a portion of top and sidewall surfaces of the second fin.

14. The method of forming a semiconductor structure according to claim 13, wherein the first high-K gate dielectric layer, the interfacial layer, and the second high-K gate dielectric layer are formed by:

removing the first dummy gate structure and forming a first opening within the interlayer dielectric layer in the NMOS region to expose the first fin;

forming the first high-K gate dielectric layer at a bottom and sidewalls of the first opening;

removing the second dummy gate structure and forming a second opening within the interlayer dielectric layer in the PMOS region to expose the second fin;

forming the interfacial layer at the bottom of the second opening and exposing sidewalls of the second opening;

forming the second high-K gate dielectric layer on the first high-K gate dielectric layer, on the interfacial layer, and on the sidewall of the second opening; and filing the metal layer in the first opening and the second opening, on the second high-K gate dielectric layer.

15. A semiconductor structure, comprising:

a substrate, including an NMOS region and a PMOS region;

a first gate structure, including a first high-K gate dielectric layer on the NMOS region of the substrate, a second high-K gate dielectric layer on the first high-K gate dielectric layer, and a metal layer on the second high-K gate dielectric layer; and a second gate structure, including an interfacial layer on the PMOS region of the substrate, the second high-K gate dielectric layer on the interfacial layer, and the metal layer on the second high-K gate dielectric layer, wherein:

the interfacial layer is sandwiched by the PMOS region of the substrate and a horizontal portion of the second high-K gate dielectric layer, and a vertical portion of the second high-K gate dielectric layer is sandwiched by a sidewall of the second gate structure and the metal layer.

16. The semiconductor structure according to claim 15, wherein:

the substrate including a Group III-V compound substrate for the NMOS region and a germanium-containing substrate for the PMOS region.

17. The semiconductor structure according to claim 15, wherein:

the first high-K gate dielectric layer is made of at least one of $HfO_2$, HfSiO, HfSiON, HfTaO, HfSiO, HfZrO, $ZrO_2$ and $Al_2O_3$, and the second high-K gate dielectric layer is made of at least one of $HfO_2$, HfSiO, HfSiON, HfTaO, HfSiO, HfZrO, $ZrO_2$ and $Al_2O_3$.

18. The semiconductor structure according to claim 15, wherein:

the first high-K gate dielectric layer has a thickness in a range of about 10 Å~20 Å, the interfacial layer has a thickness in a range of about 6 Å~10 Å, and the second high-K gate dielectric layer has a thickness in a range of about 10 Å~20 Å.

19. The semiconductor structure according to claim 15, wherein:

the interfacial layer is made of germanium oxide.

20. The semiconductor structure according to claim 15, wherein:

the substrate includes a base substrate and a plurality of discrete fins on the base substrate, the plurality of discrete fins includes a first fin for the NMOS region and a second fin for the PMOS region, the first fin is made of a Group III-V compound material and the second fin is made of a germanium-containing material, the first gate structure across the first fin and covering a portion of top and sidewall surfaces of the first fin, and the second gate structure across the second fin and covering a portion of top and sidewall surfaces of the second fin.

* * * * *